United States Patent
Yuan

(10) Patent No.: US 10,204,802 B2
(45) Date of Patent: Feb. 12, 2019

(54) METHOD OF FORMING VIA HOLE, ARRAY SUBSTRATE AND METHOD OF FORMING THE SAME AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventor: Zhidong Yuan, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 15/569,759

(22) PCT Filed: Mar. 22, 2017

(86) PCT No.: PCT/CN2017/077646
§ 371 (c)(1),
(2) Date: Oct. 26, 2017

(87) PCT Pub. No.: WO2017/185921
PCT Pub. Date: Nov. 2, 2017

(65) Prior Publication Data
US 2018/0233379 A1    Aug. 16, 2018

(30) Foreign Application Priority Data

Apr. 26, 2016   (CN) .......................... 2016 1 0266177

(51) Int. Cl.
*H01L 21/48*   (2006.01)
*H01L 21/02*   (2006.01)
(Continued)

(52) U.S. Cl.
CPC ............. *H01L 21/486* (2013.01); *G09G 3/20* (2013.01); *H01L 21/02345* (2013.01);
(Continued)

(58) Field of Classification Search
CPC ......... H01L 21/76802; H01L 21/76843; H01L 27/3262; H01L 27/1262
See application file for complete search history.

(56) References Cited

U.S. PATENT DOCUMENTS

2006/0113903 A1   6/2006  Kim
2006/0141789 A1   6/2006  Kido
(Continued)

FOREIGN PATENT DOCUMENTS

CN   1783508 A   6/2006
CN   1797216 A   7/2006
(Continued)

OTHER PUBLICATIONS

International Search Report and Written Opinion (including English translation) dated Jun. 26, 2017, for corresponding PCT Application No. PCT/CN2017/077646.
(Continued)

*Primary Examiner* — Changhyun Yi
(74) *Attorney, Agent, or Firm* — Kinney & Lange, P.A.

(57) ABSTRACT

The present disclosure provides a method of forming a via hole, an array substrate and a method of forming the same and a display device. The method of forming a via hole includes: forming a pattern of a first via hole and a pattern of an upper-part etched structure of a second via hole simultaneously on a base substrate through a first patterning process by using a first mask; forming a pattern of the second hole in a region corresponding to the formed pattern of the upper-part etched structure of the second via hole through a second patterning process by using a second mask.

8 Claims, 7 Drawing Sheets

(51) Int. Cl.
*G09G 3/20* (2006.01)
*H01L 21/4757* (2006.01)
*H01L 21/475* (2006.01)
*H01L 29/417* (2006.01)
*H01L 21/77* (2017.01)
*H01L 21/768* (2006.01)
*H01L 21/47* (2006.01)

(52) U.S. Cl.
CPC ............ *H01L 21/47* (2013.01); *H01L 21/475* (2013.01); *H01L 21/47573* (2013.01); *H01L 21/768* (2013.01); *H01L 21/77* (2013.01); *H01L 29/41733* (2013.01)

(56) References Cited

U.S. PATENT DOCUMENTS

| | | |
|---|---|---|
| 2011/0108840 A1 | 5/2011 | Lee et al. |
| 2015/0214120 A1 | 7/2015 | Yang et al. |
| 2015/0243722 A1* | 8/2015 | Kwon ................ H01L 27/3262 257/40 |
| 2016/0064421 A1* | 3/2016 | Oh ..................... H01L 27/1222 257/43 |
| 2016/0240567 A1 | 8/2016 | Li et al. |
| 2017/0110527 A1 | 4/2017 | Li |
| 2017/0243902 A1 | 8/2017 | Li |
| 2018/0122744 A1* | 5/2018 | Brain ................ H01L 21/31144 |

FOREIGN PATENT DOCUMENTS

| | | |
|---|---|---|
| CN | 101452163 A | 6/2009 |
| CN | 102420175 A | 4/2012 |
| CN | 102751241 A | 10/2012 |
| CN | 103337475 A | 10/2013 |
| CN | 103337507 A | 10/2013 |
| CN | 103489786 A | 1/2014 |
| CN | 104022079 A | 9/2014 |
| CN | 104867942 A | 8/2015 |
| CN | 105789115 A | 7/2016 |

OTHER PUBLICATIONS

First Chinese Office Action, for Chinese Patent Application No. 201610266177.5, dated Mar. 28, 2018, 15 pages.

* cited by examiner

US 10,204,802 B2

METHOD OF FORMING VIA HOLE, ARRAY SUBSTRATE AND METHOD OF FORMING THE SAME AND DISPLAY DEVICE

CROSS-REFERENCE TO RELATED APPLICATIONS

The present application claims priority to Chinese Patent Application No. 201610266177.5, filed on Apr. 26, 2016, entitled "Method of forming via hole, array substrate and method of forming the same and display device", which is incorporated herein by reference in its entirety.

BACKGROUND

Technical Field

The present disclosure relates to technical field of display, and particularly to a method of forming a via hole, an array substrate and a method of forming the same, and a display device.

Description of the Related Art

Currently, with rapid development of display technology, a display panel increasingly becomes being favored by consumers. In field of producing a display panel, via hole is important and is provided to achieve connections between functional layers. However, during patterning process of formation of a plurality of patterns of via holes, there is risk of occurrence of electro-static discharge (ESD) and damage to a surface of a film or a layer that is exposed to etch process due to excessive etch time.

For example, for forming patterns of two via holes with different depths, a corresponding film is etched. However, as the patterns of two via holes have different depths, different etching time are actually required for forming the patterns of two via holes, that is, actual etching time $t_2$ for the pattern of via hole with a greater depth will be longer than actual etching time $t_1$ for the pattern of via hole with a smaller depth. In this situation, the formation of the patterns of two via holes by a single patterning process inevitably causes some films to be exposed to etching gas for a time period and thus the exposed film will be damaged. In addition, when the patterns of two via holes are formed by two patterning processes, the actual etching time will be excessive long and probability of occurrence of ESD will be increased. Further, the surface of the exposed film will be still damaged.

SUMMARY

Embodiments of the present disclosure provide a method of forming a via hole, an array substrate and a method of forming the same and a display device, and may reduce formation time of all via holes, increase producing efficiency, reduce probability of occurrence of ESD and increase product yield.

Thus, an embodiment of the present disclosure provides a method of forming a via hole, including:

forming a pattern of a first via hole and a pattern of an upper-part etched structure of a second via hole simultaneously on a base substrate through a first patterning process by using a first mask; and forming a pattern of the second hole in a region corresponding to the formed pattern of the upper-part etched structure of the second via hole through a second patterning process by using a second mask.

In an optional embodiment, in the above method according to the embodiment, a depth of the second via hole is greater than a depth of the first via hole.

In an optional embodiment, in the above method according to the embodiment, the forming a pattern of a first via hole and a pattern of an upper-part etched structure of a second via hole simultaneously on a base substrate through a first patterning process by using a first mask comprises:

forming a film layer in which the via holes are to be formed and a first photoresist layer on the base substrate in sequence;

exposing and developing the first photoresist layer by using the first mask;

performing a dry etch process on the film layer in which the via holes are to be formed by using the developed first photoresist layer as a masking film, so as to simultaneously forming the pattern of the first via hole and the pattern of the upper-part etched structure of the second via hole; and peeling off the photoresist layer that has been developed.

In an optional embodiment, in the above method according to the embodiment, the first mask has a first light transmission region corresponding to a position where the first via hole is located and a second light transmission region corresponding to a position where the second via hole is located.

In an optional embodiment, in the above method according to the embodiment, the forming a pattern of the second hole in a region corresponding to the pattern of the upper-part etched structure of the second via hole through a second patterning process by using a second mask comprises:

forming a second photoresist layer over the base substrate on which the pattern of the first via hole and the pattern of the upper-part etched structure of the second via hole have been formed;

exposing and developing the second photoresist layer by using the second mask;

performing a dry etch process on a region corresponding to the formed pattern of the upper-part etched structure of the second via hole by using the developed second photoresist layer as a masking film, to form the pattern of the second via hole; and peeling off the second photoresist layer that has been developed.

In an optional embodiment, in the above method according to the embodiment, the second mask has a third light transmission region corresponding to a position where the second via hole is located.

Embodiments of the present disclosure further disclose a method of forming an array substrate, the array substrate comprising a switch thin film transistor and a drive thin film transistor, wherein the method comprises:

forming patterns of gate electrodes, a gate insulating layer and oxide semiconductor layers for both the switch thin film transistor and the drive thin film transistor on a base substrate in sequence;

forming an etch stoping film over the base substrate, on which the patterns of the oxide semiconductor layers of the switch thin film transistor and the drive thin film transistor have been formed;

performing a first patterning process on the etch stoping film by using a first mask to simultaneously form patterns of a first via hole, an upper-part etched structure of a second via hole and a third via hole, the first via hole being configured to respectively connect the oxide semiconductor layer of the switch thin film transistor to a source electrode and a drain electrode of the switch thin film transistor to be formed, the second via hole being configured to connect the gate electrode of the drive thin film transistor to the drain electrode of the switch thin film transistor to be formed, the third via hole being configured to respectively connect the oxide semiconductor layer of the drive thin film transistor to a source electrode and a drain electrode of the drive thin film transistor to be formed; and performing a second patterning process on a region corresponding to the formed pattern of the upper-part etched structure of the second via hole by using a second mask, to form a pattern of the second via hole.

In an optional embodiment, in the above method according to the embodiment, depths of the second via hole is greater than a depth of the first via hole and the third via hole.

In an optional embodiment, in the above method according to the embodiment, the performing a first patterning process on the etch stoping film by using a first mask to simultaneously form patterns of a first via hole, an upper-part etched structure of a second via hole and a third via hole comprises:

forming a first photoresist layer over the etch stopping film;

exposing and developing the first photoresist layer by using the first mask;

performing a dry etch process on the etch stopping film by using the developed first photoresist layer as a masking film, to form a pattern of the first via hole and a pattern of the upper-part etched structure of the second via hole and expose the oxide semiconductor layers of the switch thin film transistor and the drive thin film transistor; and peeling off the first photoresist layer that has been developed.

In an optional embodiment, in the above method according to the embodiment, the first mask has a first light transmission region corresponding to a position where the first via hole is located, a second light transmission region corresponding to a position where the second via hole is located and a third light transmission region corresponding to a position where the third via hole is located.

In an optional embodiment, in the above method according to the embodiment, the performing a second patterning process on a region corresponding to a pattern of the upper-part eteched structure of the second via hole that has been formed by using a second mask, to form a pattern of the second via hole comprises:

forming a second photoresist layer over the base substrate on which the pattern of the upper-part etched structure of the second via hole has been formed;

exposing and developing the second photoresist layer by using the second mask;

performing a dry etch process on a region corresponding to the formed pattern of the upper-part eteched structure of the second via hole by using the developed second photoresist layer as a masking film to form the pattern of the second via hole, exposing the gate electrode of the drive thin film transistor; and peeling off the second photoresist layer that has been developed.

In an optional embodiment, in the above method according to the embodiment, the second mask has a fourth light transmission region corresponding to a position where the second via hole is located.

In an optional embodiment, the above method according to the embodiment may further include:

simultaneously forming a pattern of the source and drain electrodes of the switch thin film transistor and the drive thin film transistor and a pattern of connections of the gate electrodes, the source electrodes and the drain electrodes of the switch thin film transistor and the drive thin film transistor on the base substrate, on which the patterns of the first via hole, the second via hole and the third via hole have been formed.

Embodiments of the present disclosure further provide an array substrate formed by the above method.

Embodiments of the present disclosure further provide a display device including the above array substrate.

DETAILED DESCRIPTION OF PREFERRED EMBODIMENTS

Figure 1:
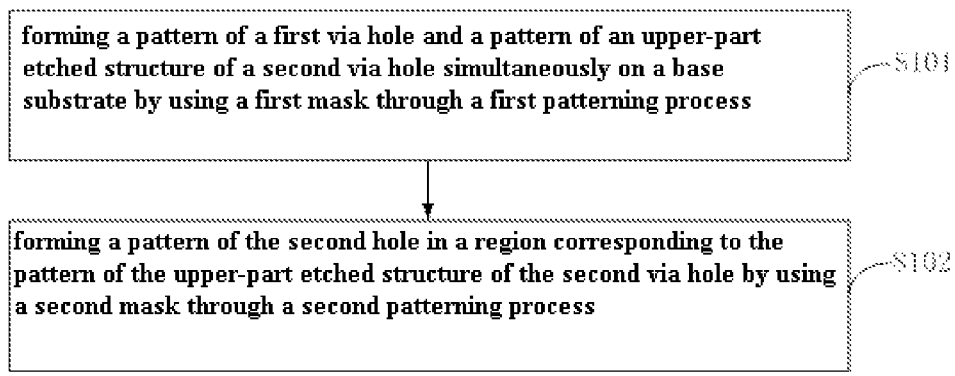
FIG. 1 is a first flow chart of a method of forming a via hole according to an embodiment of the present disclosure.

Embodiments of a method of forming a via hole, an array substrate and a method of forming the same and a display device of the present disclosure will be below described in detail in conjunction with the drawings.

In the description, depths and shapes of films/layers in the drawings do not represent true scales of the via hole and the array substrate, but are intended to schematically illustrate the content of the present disclosure.

An embodiment of the present disclosure provides a method of forming a via hole, as shown in FIG. 1, the method including steps of:

S101, forming a pattern of a first via hole and a pattern of an upper-part etched structure of a second via hole simultaneously on a base substrate by using a first mask through a first patterning process;

S102, forming a pattern of the second hole in a region corresponding to the pattern of the upper-part etched structure of the second via hole by using a second mask through a second patterning process.

The above method of forming the via hole provided by the embodiment of the present disclosure includes: firstly, forming the pattern of the first via hole and the pattern of the upper-part etched structure of the second via hole simultaneously on the base substrate; and then, forming the pattern of the second via hole, by using a second mask, in the region corresponding to the formed pattern of the upper-part etched structure of the second via hole. The method may reduce time for etching all via holes, increase producing efficiency and reduce probobility of electro-static discharge (ESD) and increase product yield.

It is noted that the above method of forming a via hole provided by the embodiment of the present disclosure may be suitable to a process for forming a via hole pattern in which via holes have difference depths, for example, suitable to a process of forming a drive thin film transistor and a switch thin film transistor on an array substrate or other processes. The process to which the above method of forming a via hole is suitable is not limited herein and the method may be implemented in a process according to actual conditions.

In practice, in the method of forming a via hole provided by embodiments of the present disclosure, as the upper-part etched structure of the second via hole and the first via hole are firstly formed and the second via hole is subsequently formed, the first via hole and the second via hole have different depths. In the embodiment, the depth of the second via hole is greater than the depth of the first via hole. It is understood that the first via hole and the second via hole are merely used to represent different via holes with different depths in an array substrate, and the embodiment is adapted to situations where various via holes, for example, via holes having depths, such as a first via hole, a second via hole, a first via hole, a second via hole, or the like, are provided on an array substrate. For example, after the second via hole is formed, the first via hole may be formed in a region corresponding to the formed pattern of the upper-part etched structure of the second via hole by using a first mask through a first patterning process. Similarly, other via holes with greater depths may also be formed.

Figure 2:
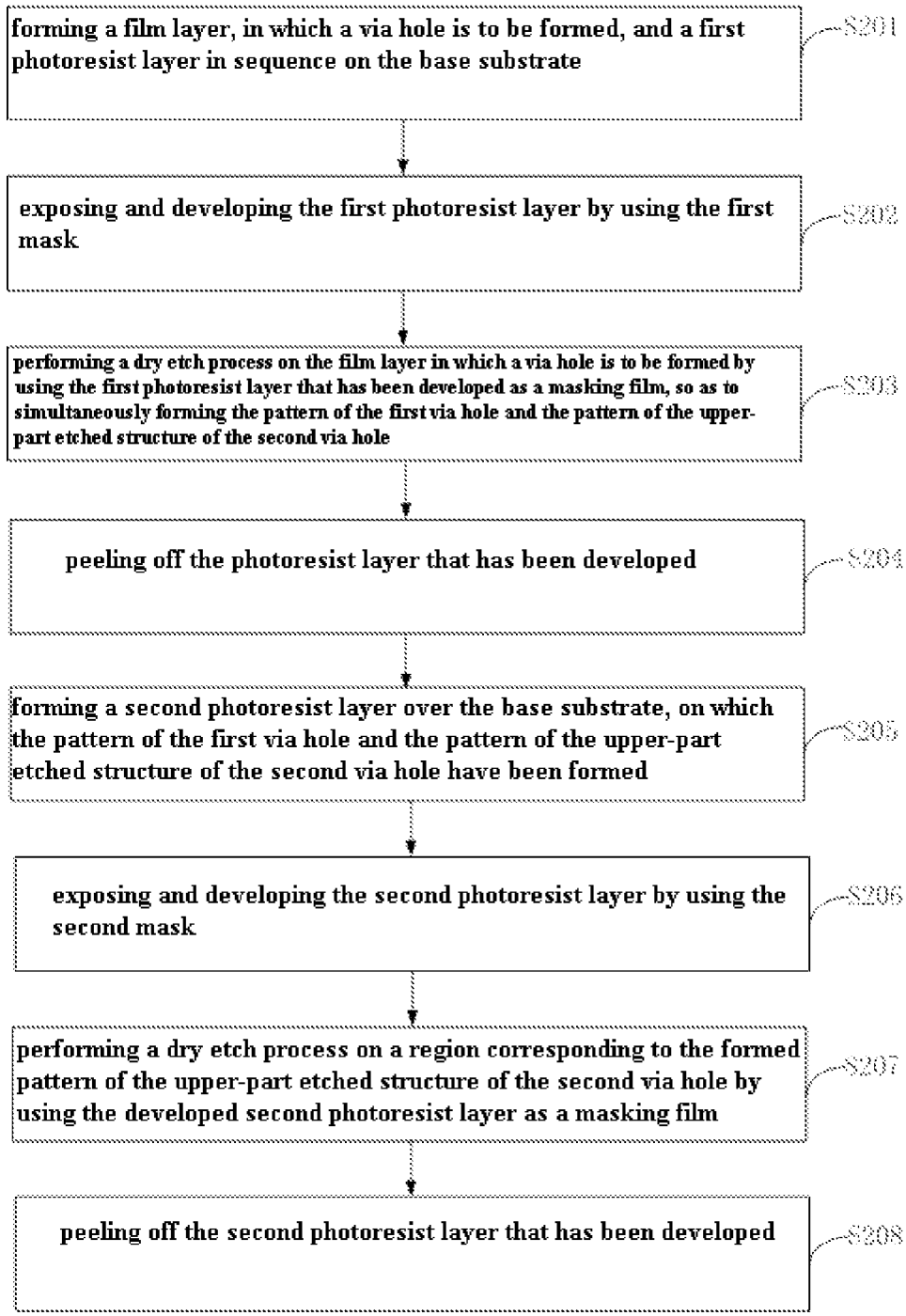
FIG. 2 is a second flow chart of a method of forming a via hole according to an embodiment of the present disclosure.

In practice, in the method of forming a via hole provided by the embodiment of the present disclosure, the step S101 is performed to form the pattern of the first via hole and the pattern of the upper-part etched structure of the second via hole by using the first mask through the first patterning process, as shown in FIG. 2. The step S101 may be specifically implemented in the following manner:

S201, forming a film layer, in which a via hole is to be formed, and a first photoresist layer in sequence on the base substrate;

S202, exposing and developing the first photoresist layer by using the first mask;

S203, performing a dry etch process on the film layer in which a via hole is to be formed by using the first photoresist layer that has been developed as a masking film, so as to simultaneously forming the pattern of the first via hole and the pattern of the upper-part etched structure of the second via hole; and S204, peeling off the photoresist layer that has been developed.

It is noted that, in practice, when the pattern of the first via hole is obtained, the dry etch process is stopped, the second via hole is still not formed completely and only the pattern of the upper-part etched structure of the second via hole is formed; the critical dimension (CD) of the pattern of the upper-part etched structure of the second via hole may be slightly reduced to improve angles in the etched profile.

In practice, in the above method of forming a via hole provided by the embodiment of the present disclosure, the above first mask may include a first light transmission region corresponding to the position where the first via hole is located and a second light transmission region corresponding to the position where the second via hole is located.

In practice, in the above method of forming the via hole provided by the embodiment of the present disclosure, the step S102 is implemented by using the second mask through the second patterning process to form the pattern of the second via hole in the region corresponding to the formed pattern of the upper-part etched structure of the second via hole. As shown in FIG. 2, the step S102 may be specifically implemented in the following manner:

S205, forming a second photoresist layer over the base substrate, on which the pattern of the first via hole and the pattern of the upper-part etched structure of the second via hole have been formed;

S206, exposing and developing the second photoresist layer by using the second mask;

S207, performing a dry etch process on a region corresponding to the formed pattern of the upper-part etched structure of the second via hole by using the developed second photoresist layer as a masking film; and S208, peeling off the second photoresist layer that has been developed.

In practice, in the above method of forming a via hole provided by the embodiment of the present disclosure, the second mask has a third light transmission region corresponding to the position where the second via hole is located.

Figure 3A:
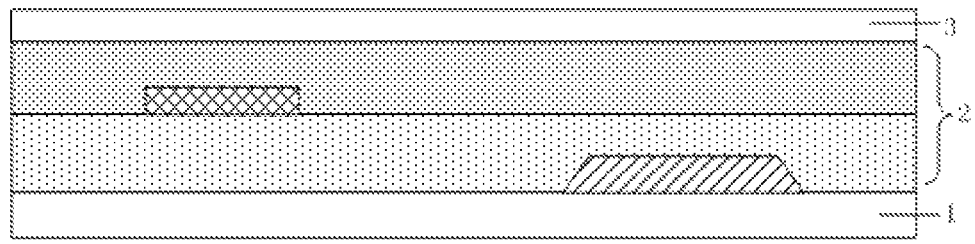
FIGS. 3a~3f are respectively structural schematic views of structures obtained after performing steps of a method of forming a via hole according to an embodiment of the present disclosure.
Figure 3B:
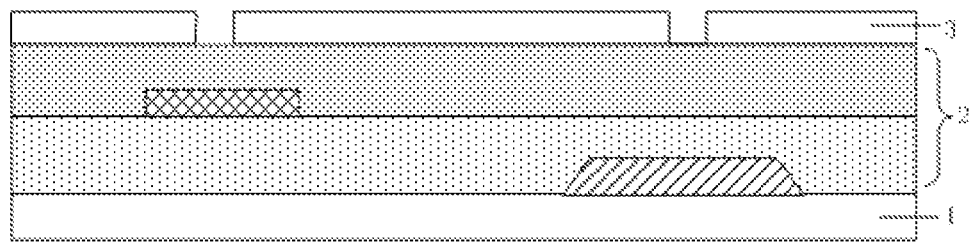
Figure 3C:
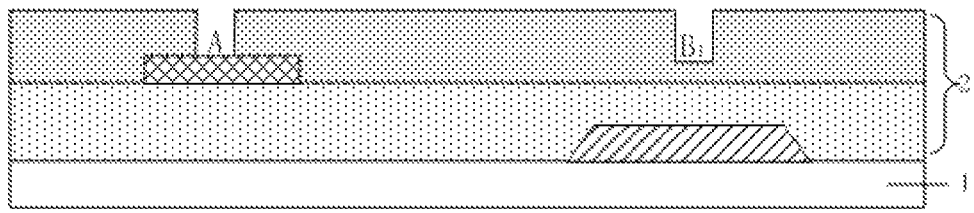
Figure 3D:
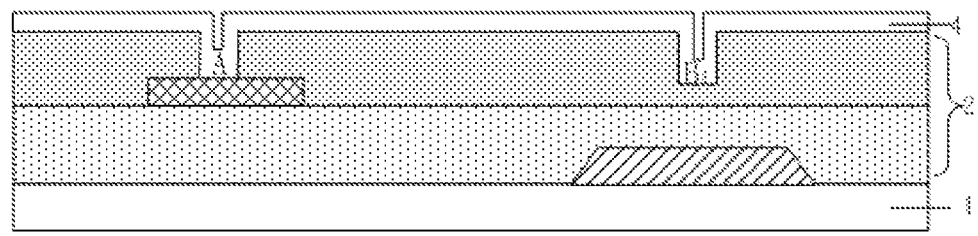
Figure 3E:
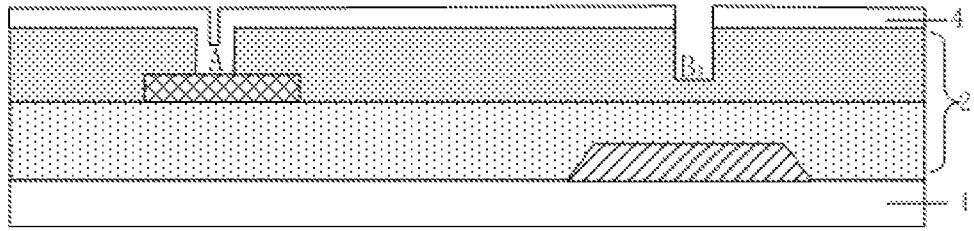

The method of forming a via hole provided by the embodiment of the present disclosure will be described in detail in a specific example. A process of manufacturing a via hole may include the following specific steps:

Step 1, forming a film layer, in which the via hole is to be formed, and a first photoresist layer on a base substrate in sequence;

In practice, as shown in FIG. 3a, the film layer 2 in which the via hole is to be formed is formed on the base substrate 1, and the first photoresist layer 3 is coated over the film layer 2;

Step 2, exposing and developing the first photoresist layer by using the first mask;

In practice, as shown in FIG. 3b, transmission regions in the first mask respectively correspond to positions where the first via hole and the second via hole are located respectively; the first photoresist layer 3 is exposed and developed by using the first mask so as to form a photoresist fully removed region in a region (i.e., the region needed to be exposed) of the first photoresist layer 3 that corresponds to a region to be removed of the film layer 2 in which the via hole is to be formed;

Step 3, performing a dry etch process on the film layer in which the via hole is to be formed by using the developed first photoresist layer as a masking film, so as to simultaneously forming the pattern of the first via hole and the pattern of the upper-part etched structure of the second via hole; and peeling off the photoresist layer that has been developed;

In practice, as shown in FIG. 3c, the dry etch process is performed on the film layer 2 in which the via hole is to be formed by using the developed first photoresist layer 3 as a masking film to simultaneously form the pattern of the first via hole A and the pattern of the upper-part etched structure $B_1$ of the second via hole, and then the developed first photoresist layer 3 is peeled off. It is noted that the pattern of the first via hole A and the pattern of the upper-part etched structure $B_1$ of the second via hole may have the same height, that is, when the pattern of the first via hole A is obtained, the dry etch process is stopped, the second via hole is still not completely formed, and rather, only the pattern of the upper-part etched structure $B_1$ of the second via hole is formed;

Step 4, forming a second photoresist layer over the base substrate on which the pattern of the first via hole and the pattern of the upper-part etched structure of the second via hole have been formed;

In practice, as shown in FIG. 3d, the second photoresist layer 4 is formed over the base substrate 1 on which the pattern of the upper-part etched structure $B_1$ of the second via hole has been formed;

Step 5, exposing and developing the second photoresist layer by using the second mask;

In practice, as shown in FIG. 3e, the second mask has a light transmission region corresponding to the position where the second via hole is located; the second photoresist layer 4 is exposed and developed by using the second mask;

Step 6, performing a dry etch process on a region corresponding to the formed pattern of the upper-part etched structure of the second via hole by using the developed second photoresist layer as a masking film, so as to form the pattern of the second via hole, and then peeling off the second photoresist layer that has been developed.

Figure 3F:
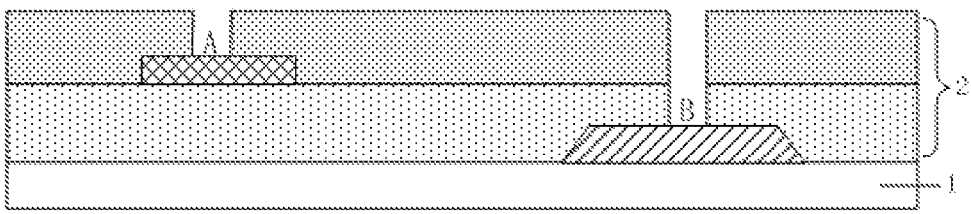

In practice, as shown in FIG. 3f, a dry etch process is performed on the region corresponding to the formed pattern of the upper-part etched structure $B_1$ of the second via hole by using the developed second photoresist layer 4 as a masking film, so as to form the pattern of the second via hole B, and then the second photoresist layer 4 that has been developed is peeled off.

To this, the via hole may be formed according to the embodiment of the present disclosure.

Figure 4:
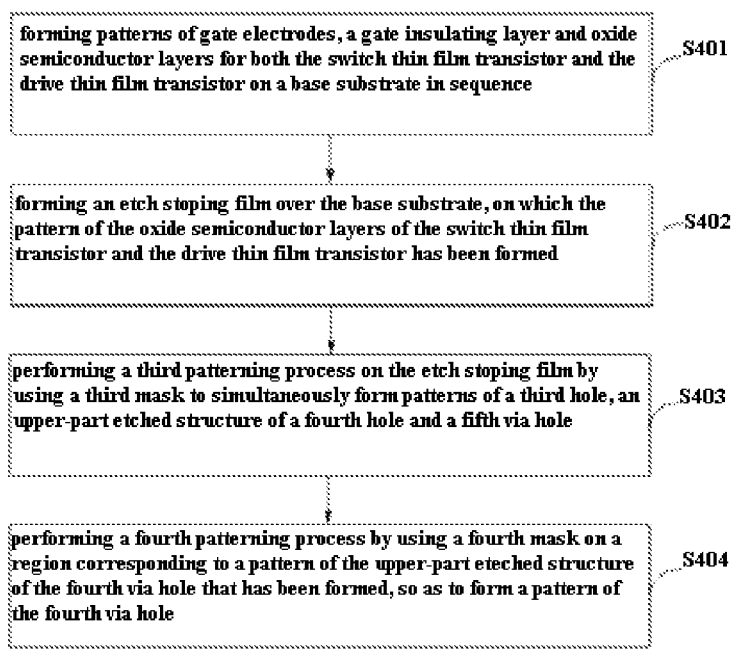
FIG. 4 is a first flow chart of a method of forming an array substrate according to an embodiment of the present disclosure.

Based on the same inventive concept, an embodiment of the present disclosure further provides a method of forming an array substrate, the array substrate including a switch thin film transistor and a drive thin film transistor, as shown in FIG. 4, the method including steps of:

S401, forming patterns of gate electrodes, a gate insulating layer and oxide semiconductor layers for both the switch thin film transistor and the drive thin film transistor on a base substrate in sequence;

S402, forming an etch stoping film over the base substrate, on which the pattern of the oxide semiconductor layers of the switch thin film transistor and the drive thin film transistor has been formed;

S403, performing a first patterning process on the etch stoping film by using a first mask to simultaneously form patterns of a first via hole, an upper-part etched structure of a second via hole and a third via hole, the first via hole being configured to respectively connect the oxide semiconductor layer of the switch thin film transistor to a source electrode and a drain electrode of the switch thin film transistor to be formed, the second via hole being configured to connect a gate electrode of the drive thin film transistor to the drain electrode of the switch thin film transistor to be formed, the third via hole being configured to respectively connect the oxide semiconductor layer of the drive thin film transistor to a source electrode and a drain electrode of the drive thin film transistor to be formed;

S404, performing a second patterning process by using a second mask on a region corresponding to a pattern of the upper-part eteched structure of the second via hole that has been formed, so as to form a pattern of the second via hole.

The above method of forming an array substrate according to the embodiment of the present disclosure includes: firstly, forming patterns of the gate electrodes, the gate insulating layer and the oxide semiconductor layers of the switch thin film transistor and the drive thin film transistor on the base substrate in sequence; then, forming the etch stoping film on the base substrate, on which the patterns of the oxide semiconductor layers of the switch thin film transistor and the drive thin film transistor have been formed; subsequently, performing the first patterning process on the etch stoping film by using the first mask to simultaneously form patterns of the first via hole, the upper-part etched structure of the second via hole and the third via hole, wherein the first via hole is configured to respectively connect the oxide semiconductor layer of the switch thin film transistor to the source electrode and the drain electrode of the switch thin film transistor to be formed, the second via hole is configured to connect the gate electrode of the drive thin film transistor to the drain electrode of the switch thin film transistor to be formed, and the third via hole is configured to respectively connect the oxide semiconductor layer of the drive thin film transistor to the source electrode and the drain electrode of the drive thin film transistor to be formed; finally, the second patterning process is performed on the region corresponding to the formed pattern of the upper-part eteched structure of the second via hole by using the second mask, to form a pattern of the second via hole. The method according to the embodiment, when performed, may reduce time spending on formation of all via holes, increase producing efficiency, and may not only reduce probability of ESD but also reduce probability of oxidation of gate electrode while reducing probability of damage to the surface of the semiconductor layer, improving yield.

In practice, in the method of forming a via hole provided by embodiments of the present disclosure, the pattern of the first via hole, the second via hole and the upper-part etched structure of the third via hole is firstly formed and then the pattern of the second via hole is formed, that is, the first via hole and the third via hole have a depth different from a depth of the second via hole, and the depth of the second via hole is greater than the depths of the first via hole and the third via hole. It is noted that various via holes having various depths may be formed in similar steps, that is, the via holes with less smaller depth may be firstly formed and the via hole with greater depth may be formed subsequently.

Figure 5:
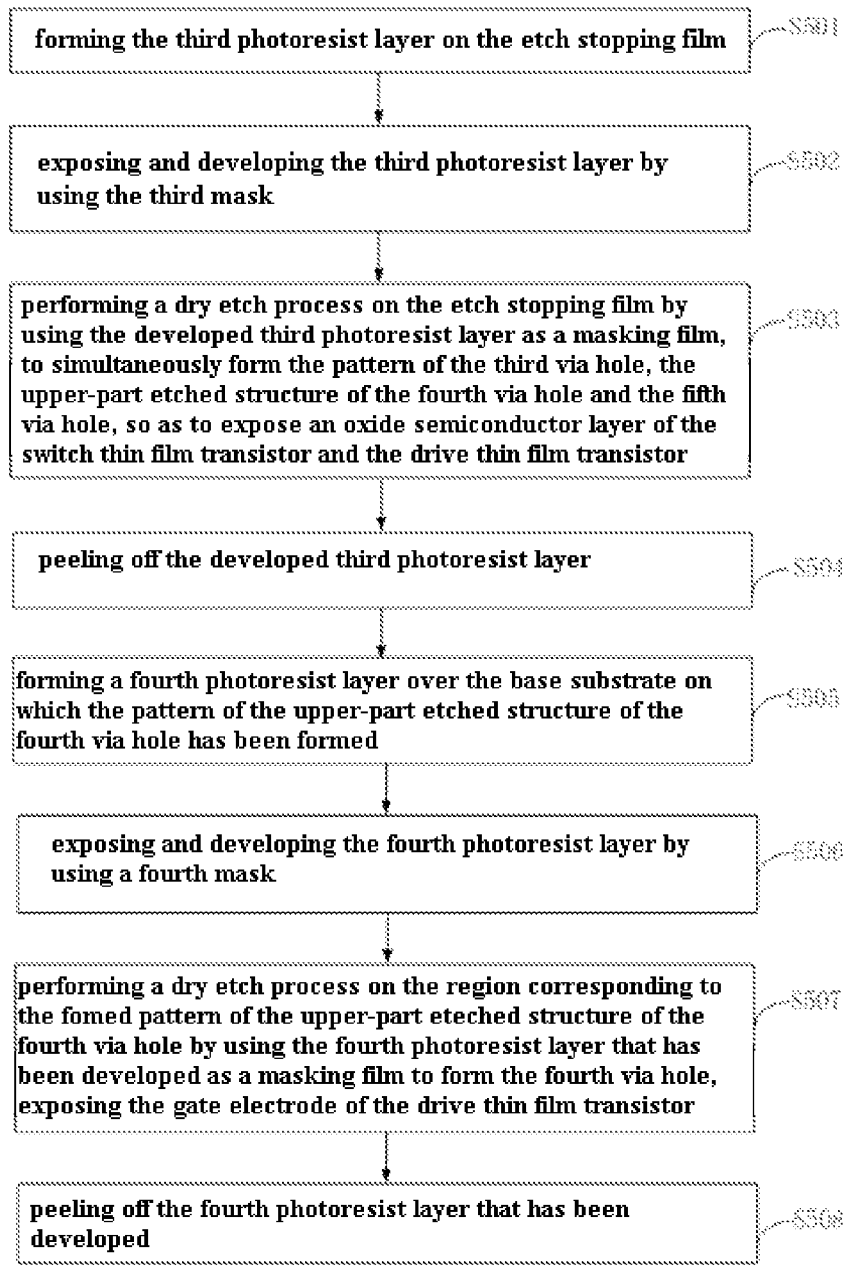
FIG. 5 is a second flow chart of a method of forming an array substrate according to an embodiment of the present disclosure.

In practice, in the method of forming an array substrate provided by embodiments of the present disclosure, step S403 includes simultaneously forming the pattern of the first via hole, the upper-part etched structure of the second via hole and the third via hole by performing the first patterning process on the etch stopping film by using the first mask. As shown in FIG. 5, it may be specifically implemented in the following manner:

Step S501, forming the first photoresist layer on the etch stopping film;

Step S502, exposing and developing the first photoresist layer by using the first mask;

Step S503, performing a dry etch process on the etch stopping film by using the developed first photoresist layer as a masking film, to simultaneously form the pattern of the first via hole, the upper-part etched structure of the second via hole and the third via hole, so as to expose an oxide semiconductor layer of the switch thin film transistor and the drive thin film transistor; and S504, peeling off the developed first photoresist layer.

It is noted that, in practice, when the pattern of the first via hole and the third via hole is obtained, the dry etch process is stopped, and at this time, the second via hole is still not completely formed, and rather, only the pattern of the upper-part etched structure of the second via hole is formed; a critical dimension (CD) of the formed pattern of the upper-part etched structure of the second via hole may be slightly reduced so as to improve angles in the etched profile.

In practice, in the method of forming an array substrate provided by embodiments of the present disclosure, the first mask has a first light transmission region corresponding to a position where the first via hole is located, a second light transmission region corresponding to a position where the second via hole is located and a third light transmission region corresponding to a position where the third via hole is located.

In practice, in the method of forming an array substrate provided by embodiments of the present disclosure, step S404 is implemented by performing the second patterning process on the region corresponding to the formed pattern of the upper-part etched structure of the second via hole by using the second mask, so as to form the pattern of the second via hole. As shown in FIG. 5, it may be specifically implemented in the following manner:

Step S505, forming a second photoresist layer over the base substrate on which the pattern of the upper-part etched structure of the second via hole has been formed;

Step S506, exposing and developing the second photoresist layer by using a second mask;

Step S507, performing a dry etch process on the region corresponding to the formed pattern of the upper-part eteched structure of the second via hole by using the second photoresist layer that has been developed as a masking film to form the second via hole, exposing the gate electrode of the drive thin film transistor; and Step S508, peeling off the second photoresist layer that has been developed.

In practice, in the method of forming an array substrate provided by embodiments of the present disclosure, the second mask has a fourth light transmission region corresponding to a position where the second via hole is located.

In practice, the method of forming an array substrate provided by embodiments of the present disclosure further includes: simultaneously forming a pattern of the source and drain electrodes of the switch thin film transistor and a pattern of the source and drain electrodes of the drive thin film transistor, and forming a pattern of connections of the gate electrodes, the source electrodes and the drain electrodes of the switch thin film transistor and the drive thin film transistor, on the base substrate on which the patterns of the first via hole, the second via hole and the third via hole have been formed.

Figure 6A:
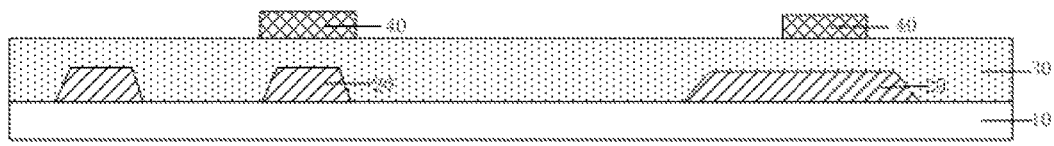
FIG. 6a~6h are respectively structural schematic views of structures obtained after performing steps of a method of forming an array substrate according to an embodiment of the present disclosure.
Figure 6B:
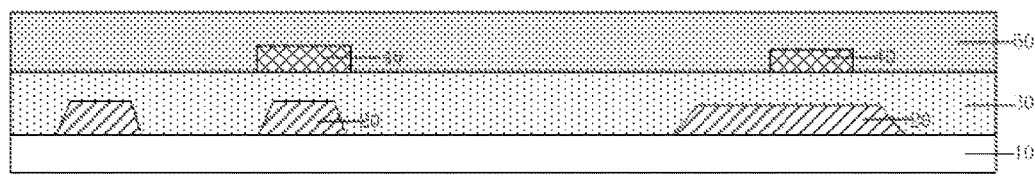
Figure 6C:
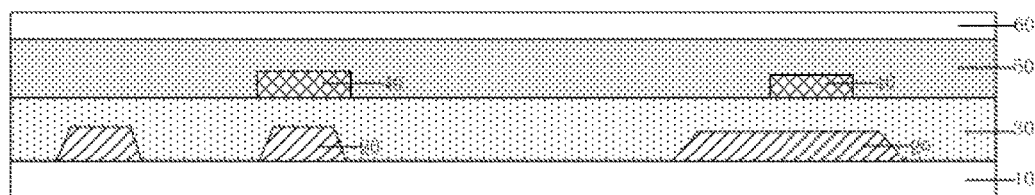
Figure 6D:
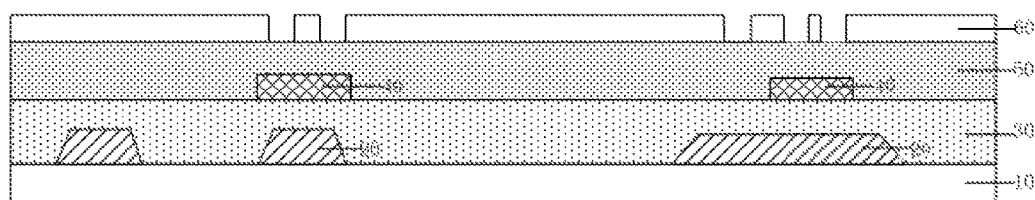
Figure 6E:
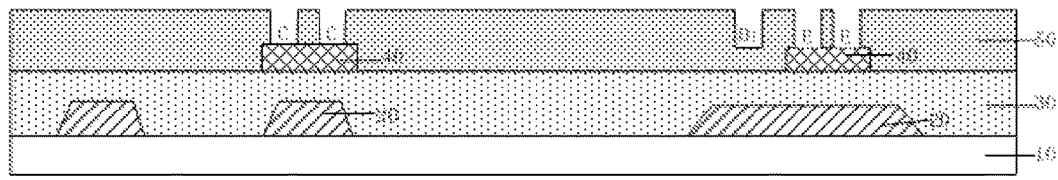
Figure 6F:
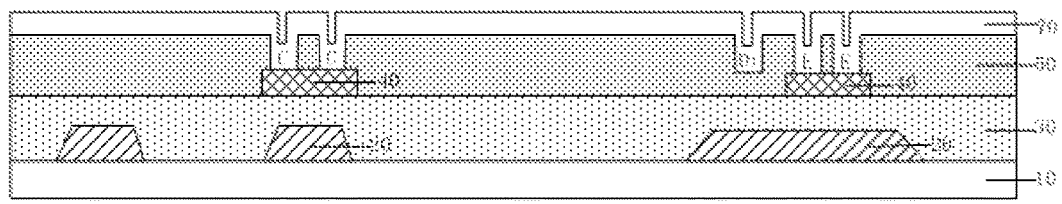

The method of forming an array substrate according to embodiments of the present disclosure will be described in detail by reference to a specific example. The specific steps of forming an array substrate include:

Step 1, forming patterns of gate electrodes, a gate insulating layer and oxide semiconductor layers for both a switch thin film transistor and a drive thin film transistor on a base substrate in sequence;

In practice, as shown in FIG. 6a, the patterns of the gate electrodes 20 of the the switch thin film transistor and the drive thin film transistor are firstly simultaneously formed on the base substrate 10; then, the pattern of the gate insulating layer 30 is formed on the base substrate on which the patterns of the gate electrodes 20 of the the switch thin film transistor and the drive thin film transistor are formed; subsequently, the patterns of the oxide semiconductor layers 40 of the switch thin film transistor and the drive thin film transistor are simultaneously on the pattern of the gate insulating layer 30; zinc gallium indium oxide (IGZO) may be selected as the material for forming the oxide semiconductor layer;

Step 2, forming an etch stopping film over the base substrate, on which the patterns of the oxide semiconductor layers of the switch thin film transistor and the drive thin film transistor have been formed;

In practice, as shown in FIG. 6b, the etch stopping film 50 is formed over the base substrate 10, on which the patterns of the oxide semiconductor layers 40 of the switch thin film transistor and the drive thin film transistor have been formed;

Step 3, forming a first photoresist layer over the etch stopping film;

In practice, as shown in FIG. 6c, the first photoresist layer 60 is coated over the etch stopping film 50;

Step 4, exposing and developing the first photoresist layer by using a first mask;

In practice, as shown in FIG. 6d, various light transmission regions of the first mask respectively correspond to a position where the first via hole is located, a position wherein the second via hole is located and a position where the third via hole is located; the first photoresist layer 60 is exposed and developed by using the first mask to form a photoresist fully removed region in a region (i.e., a region that is needed to be exposed) of the first photoresist layer 60 that corresponds to the region to be removed of the etch stopping film 50 in which the via holes are to be formed;

Step 5, performed a dry etch process on the etch stopping film by using the developed first photoresist layer as a masking film to simultaneously form the pattern of the first via hole and the patterns of the upper-part etched structure of the second via hole and the third via hole, so as to expose the oxide semiconductor layers of the switch thin film transistor and the drive thin film transistor; and peeling off the developed first photoresist layer;

In practice, as shown in FIG. 6e, the dry etch process is performed on the etch stopping film by using the developed first photoresist layer 60 as a masking film, to simultaneously form the pattern of the first via hole C and the patterns of the upper-part etched structure $D_1$ of the second via hole and the third via hole E, so as to expose the oxide semiconductor layers of the switch thin film transistor and the drive thin film transistor; and then the developed first photoresist layer 60 is peeled off. It is noted that depths of the pattern of the first via hole C, the pattern of the upper-part etched structure $D_1$ of the second via hole and the pattern of the third via hole E may be the same, that is, when the pattern of the first via hole C and the pattern of the third via hole are obtained, the dry etch process is stopped and at this time, the second via hole is still not completely formed, and rather, only the upper-part etched structure $D_1$ of the second via hole is formed;

Step 6, forming a second photoresist layer over the base substrate on which the pattern of the upper-part etched structure of the second via hole has been formed;

In practice, as shown in FIG. 6f, the second photoresist layer 70 is formed on the base substrate 10, on which the pattern of the upper-part etched structure $D_1$ of the second via hole has been formed.

Figure 6G:
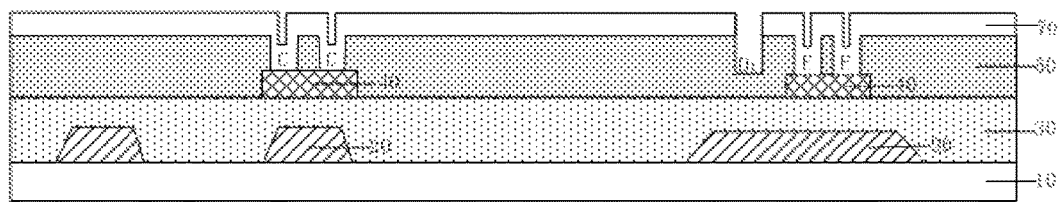

Step 7, exposing and developing the second photoresist layer by using a second mask;

In practice, as shown in FIG. 6g, the second mask has a light transmission region corresponding to a position where the second via hole is located; the second photoresist layer 70 is exposed and developed by using the second mask;

Step 8, performing a dry etch process on a region corresponding to the formed pattern of the upper-part eteched structure of the second via hole by using the developed second photoresist layer as a masking film to form the pattern of the second via hole, exposing the gate electrode of the drive thin film transistor, and peeling off the second photoresist layer that has been developed.

Figure 6H:
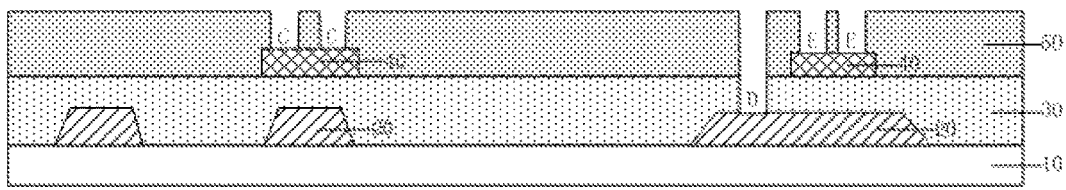

In practice, as shown in FIG. 6h, the dry etch process is performed on the region corresponding to the formed pattern of the upper-part eteched structure $D_1$ of the second via hole by using the developed second photoresist layer 70 as a masking film to form the pattern of the second via hole D, exposing the gate electrode of the drive thin film transistor, and peeling off the second photoresist layer 70 that has been developed.

To this, the above array substrate provided by embodiments of the present disclosure is formed by the above steps 1~8 according to the specific example.

It is appreciated that the above first via hole C and the third via hole E are merely intended to represent via holes with different depths that belong to different components, and however, a via hole with a greater depth may also be provided in the array substrate, such as a sixth via hole, a seventh via hole, etc. Similarly, a photoresist layer is correspondingly formed and is etched by using a corresponding mask so as to obtain the via hole with greater depth, without adversely affecting other non-related components.

Based on the same inventive concept, embodiments of the present disclosure further provide an array substrate that is formed by the above method.

Based on the same inventive concept, embodiments of the present disclosure further provide a display device including the above array substrate according to embodiments of the present disclosure. The display device may be a mobile phone, a flat computer, a television, a display, a notebook computer, a digital photo frame, a navigator or any component or product that has a display function. It is understood that the display device has other components that are dispensable and are not repeatedly described herein, and should not be considered as limitation to the present disclosure. Embodiments of the display device may be referred to the embodiments of the array substrate and are not repeatedly described herein.

The embodiments of the present disclosure provide a method of forming a via hole, an array substrate and a method of forming the same and a display device, and the method of forming a via hole includes: forming a pattern of a first via hole and a pattern of an upper-part etched structure of a second via hole simultaneously on a base substrate through a first patterning process by using a first mask; forming a pattern of the second hole in a region corresponding to the pattern of the upper-part etched structure of the second via hole through a second patterning process by using a second mask. The method may be performed to reduce time for etching all via holes, reduce probobility of electro-static discharge (ESD) and increase product yield.

It is noted that the wordings of "first", "second", "third", "fourth" or even "fifth" are used in the present disclosure are merely intended to make components that have similar functions have different names and structure and properties of these components may be determined according to actual condition and may be the same or different from each other. For example, the first photoresist and the second photoresist in forming the via hole and forming the array substrate may be respectively the same photoresist or may be different from each other, which may be determined as required. The first mask and the second mask used in forming the via hole and forming the array substrate may be respectively the same photoresist or may be different from each other. The other via hole and light transmission regions are the same case.

Obviously, those skilled in the art may make various change and modification on the embodiments of the present disclosure without departing from the inspirits and scope of the present disclosure. As such, the present disclosure is intended to include these change and modification if they fall into the scopes defined by the claims of the present disclosure and equivalents thereof.

The invention claimed is:

1. A method of forming an array substrate, the array substrate comprising a switch thin film transistor and a drive thin film transistor, wherein the method comprises:
   forming patterns of gate electrodes, a gate insulating layer and oxide semiconductor layers for both the switch thin film transistor and the drive thin film transistor on a base substrate in sequence;
   forming an etch stopping film over the base substrate, on which the patterns of the oxide semiconductor layers of the switch thin film transistor and the drive thin film transistor have been formed;
   performing a first patterning process on the etch stopping film by using a first mask to simultaneously form patterns of a first via hole, an upper-part etched structure of a second via hole and a third via hole, the first via hole being configured to respectively connect the oxide semiconductor layer of the switch thin film transistor to a source electrode and a drain electrode of the switch thin film transistor to be formed, the second via hole being configured to connect the gate electrode of the drive thin film transistor to the drain electrode of the switch thin film transistor to be formed, the third via hole being configured to respectively connect the oxide semiconductor layer of the drive thin film transistor to a source electrode and a drain electrode of the drive thin film transistor to be formed; and
   performing a second patterning process on a region corresponding to the formed pattern of the upper-part etched structure of the second via hole by using a second mask, to form a pattern of the second via hole, wherein a depth of the second via hole is greater than depths of the first via hole and the third via hole.

2. The method according to claim 1, wherein performing the first patterning process on the etch stopping film by using the first mask to simultaneously form patterns of the first via hole, the upper-part etched structure of the second via hole and the third via hole comprises:
   forming a first photoresist layer over the etch stopping film;
   exposing and developing the first photoresist layer by using the first mask;
   performing a dry etch process on the etch stopping film by using the developed first photoresist layer as a masking film, to form the pattern of the first via hole and the pattern of the upper-part etched structure of the second via hole and the third via hole and expose the oxide semiconductor layers of the switch thin film transistor and the drive thin film transistor; and
   peeling off the first photoresist layer that has been developed.

3. The method according to claim 2, wherein the first mask has a first light transmission region corresponding to a position where the first via hole is located, a second light transmission region corresponding to a position where the second via hole is located and a third light transmission region corresponding to a position where the third via hole is located.

4. The method according to claim 2, wherein performing the second patterning process on the region corresponding to the pattern of the upper-part etched structure of the second via hole that has been formed by using the second mask, to form the pattern of the second via hole comprises:

forming a second photoresist layer over the base substrate on which the pattern of the upper-part etched structure of the second via hole has been formed;

exposing and developing the second photoresist layer by using the second mask;

performing a dry etch process on the region corresponding to the formed pattern of the upper-part etched structure of the second via hole by using the developed second photoresist layer as a masking film to form the pattern of the second via hole, exposing the gate electrode of the drive thin film transistor; and peeling off a fourth photoresist layer that has been developed.

5. The method according to claim 4, wherein the second mask has a fourth light transmission region corresponding to a position where the second via hole is located.

6. The method according to claim 1, further comprising:

simultaneously forming a pattern of the source and drain electrodes of the switch thin film transistor and the drive thin film transistor and a pattern of connections of the gate electrodes, the source electrodes and the drain electrodes of the switch thin film transistor and the drive thin film transistor on the base substrate, on which the patterns of the first via hole, the second via hole and the third via hole have been formed.

7. An array substrate, wherein the array substrate is formed by the method according to claim 1.

8. A display device comprising the array substrate according to claim 7.

* * * * *